(12) United States Patent
Hara et al.

(10) Patent No.: US 8,390,383 B2
(45) Date of Patent: Mar. 5, 2013

(54) AMPLIFIER FOR RECEIVING INTERMITTENT OPTICAL SIGNAL

(75) Inventors: Hiroshi Hara, Yokohama (JP); Sosaku Sawada, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/227,618

(22) Filed: Sep. 8, 2011

(65) Prior Publication Data

US 2012/0032740 A1 Feb. 9, 2012

Related U.S. Application Data

(63) Continuation-in-part of application No. 13/167,197, filed on Jun. 23, 2011.

(30) Foreign Application Priority Data

Jun. 24, 2010 (JP) .................................. 2010-144263
Sep. 9, 2010 (JP) .................................. 2010-201921

(51) Int. Cl.
*H03F 3/08* (2006.01)

(52) U.S. Cl. ......................................... 330/308; 330/141
(58) Field of Classification Search .................. 330/141, 330/281, 308
See application file for complete search history.

(56) References Cited

U.S. PATENT DOCUMENTS

| 7,671,680 | B2 * | 3/2010 | Hara | 330/141 |
| 7,755,434 | B2 * | 7/2010 | Hara et al. | 330/308 |
| 8,054,136 | B2 * | 11/2011 | Hara | 330/308 |

FOREIGN PATENT DOCUMENTS

JP 2010-057014 3/2010

* cited by examiner

*Primary Examiner* — Khanh V Nguyen
(74) *Attorney, Agent, or Firm* — Smith, Gambrell & Russell, LLP

(57) ABSTRACT

An amplifier for receiving an optical signal is disclosed. The amplifier provides a response time controller including an integrator with two time constants, a linear amplifier, a hysteresis comparator, an another integrator, and a switch to change the time constant. The switch includes two voltage followers, one of which turns off the switch to set the time constant in a longer state; while, the other of which turns on the switch and reflects the input of the integrator to set the time constant in a shorter state.

9 Claims, 12 Drawing Sheets

AMPLIFIER FOR RECEIVING INTERMITTENT OPTICAL SIGNAL

CROSS REFERENCE TO THE RELATED APPLICATION

This application is a continuation-in-part of pending prior U.S. patent application Ser. No. 13/167,197, filed Jun. 23, 2011 by Hiroshi Hara, titled by ELECTRICAL CIRCUIT, which is hereby incorporated herein by reference.

BACKGROUND OF THE INVENTION

1. Field of the Invention

The present invention relates to an amplifier, in particular, the invention relates to an amplifier for an optical receiver.

2. Related Background Art

What is called as the PON (Passive Optical Network) communication system has became popular in the FTTH (Fiber To The Home) system. This system is necessary to convert optical signals each sent from an individual home and having a specific magnitude into an electrical signal and to amplify thus converted electrical signal. An amplifier with the function of the auto-gain control (hereafter denoted as AGC) has been also known, where the AGC circuit may adjust the gain of the amplifier based on the output thereof. A Japanese Patent Application published as JP-2010-057014A has disclosed an amplifying circuit with a level holding to stabilize a reference level provided to the input of the amplifier.

SUMMARY OF THE INVENTION

An invention according to the preset application relates to an amplifier, in particular, the invention relates to an amplifier applicable to the optical line terminal (OLT) of the PON communication system, in which the amplifier has functions of the automatic gain control (AGC) and the variable response time following the intermittently receiving data. Specifically, the amplifier comprises a trans-impedance amplifier (TIA), an integrator, a linear amplifier, a comparator, a delay unit and a switch. The integrator may change the time constants thereof between a longer time constant and a shorter time constant following the input packet data. The linear amplifier may amplifier the output of the integrator. The comparator, which has a hysteresis function, may compare the output of the linear amplifier with a reference. The delay unit may delay the compared result. The switch may change the status of the integrator between the longer time constant and the shorter time constant. Features of the present invention are the switch may include the first voltage follower and the second voltage follower selected by the output of the delay unit. The first voltage follower may transfer the output of the TIA to the integrator; while, the second voltage follower may set the output of the switch in high-impedance. Thus, when the first voltage follower is selected, two resistors involved in the integrator may be equivalently connected in parallel between the output of the TIA and the output of the integrator and set the time constant of the integrator in the shorter state. While, when the second voltage follower is selected, only the resistor directly connected to the output of the TIA constitutes the integrator and sets the time constant of the integrator in the longer state.

The feedback loop to select the time constant of the integrator may further include a buffer between the delay unit and the switch. The buffer may accelerate the change of the switch, which may make the feedback loop stable.

The first voltage follower may include the first differential circuit, the second voltage follower may include the second differential circuit, and each of the differential circuits has the common emitter follower. The first differential circuit may receive the output of the TIA. The second differential circuit may receive a control signal whose level is less than the output of the integrator. In such an arrangement, the integrator in one resistor thereof is equivalently connected to the output of the TIA 10 when the delay unit selects the first voltage follower; while, the resistor is equivalently open-ended when the delay unit selects the second voltage follower.

The first voltage follower may include two transistors constituting a differential pair and a current feeder connected in parallel to the differential pair. These differential pair and the current feeder are commonly connected to the current source. By adjusting the current flowing in the current feeder, which may control the magnitude of the voltage drop at the load resistor of the differential pair, the switching time from the reception of the output of the delay unit to set the output of the switch equivalently to the output of the TIA may be shortened.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified.

DETAILED DESCRIPTION OF PREFERRED EMBODIMENTS

Figure 1A:
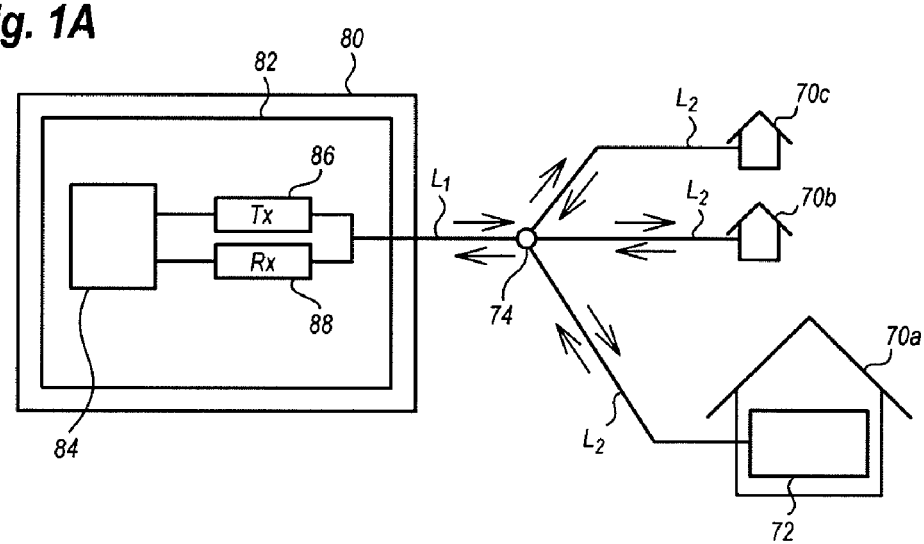
FIG. 1A is a block diagram of the PON system, and FIG. 1B schematically shows the behavior of the optical signal received by the OLT of the PON system.

First, the PON system will be described to which an amplifier according to the present invention is applicable. FIG. 1A is a block diagram of the PON system. The optical line terminal 82 (hereinafter denoted as OLT) installed in the central office 80 is optically coupled with a plurality of optical network units 72 (hereafter denoted as ONU) set in respective homes, 70a to 70c, through optical fibers, $L_1$ and $L_2$. The OLT 82 is coupled with a passive optical splitter 74 through the optical fiber $L_1$, while, the optical splitter 74 is coupled with respective ONUs 72 through the other optical fibers $L_2$. The optical splitter 74 may couple optical signals sent from the ONUS 72 in respective homes with the optical fiber $L_1$, and the optical signals thus transmitted on the optical fiber $L_1$ are received by the OLT 82. The OLT 82 includes an optical transmitter 86, an optical receiver 88, and a controller 84. The optical transmitter 86 may transmit signal light to respective optical line terminals 72, while, the optical receiver 88 may receive signal light transmitted from respective line terminals 72. The controller 84 may control the optical transmitter 86 and the optical receiver 88.

Figure 1B:
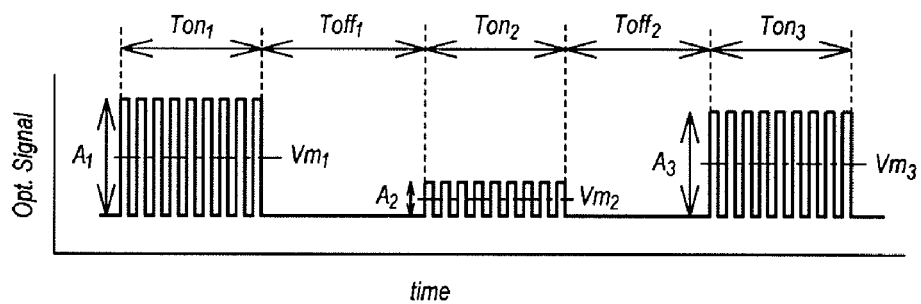

FIG. 1B schematically illustrates a time chart of an optical signal received by the optical receiver 88 in the OLT 82. The PON system shown in FIG. 1A is a type of a time division multiplexing (TDM) communication system, in which optical signals each coming from respective ONUs 72 are sequentially and intermittently received by the optical receiver 88. Specifically, as illustrated in FIG. 1B, the optical signal coming from the ONU 72 in the home 70a is received in a period $Ton_1$; the optical signal coming from the home 70b is received in another period $Ton_2$ after a suspension $Toff_1$. Further, the optical receiver 88 may receive an optical signal coming from the third home 70c in a period $Ton_3$ after another suspension $Toff_2$. Because the optical losses between the optical coupler 74 and respective homes, 70a to 70c, and the optical output power of the ONUs 72 in respective homes, 70a to 70c, are different, the amplitude of the optical signal detected by the optical receiver 88 varies as denoted by symbols, $A_1$ to $A_3$, in FIG. 1B. Thus, the optical receiver 88 of the central office 80 in the PON system is necessary to receive optical signals intermittently and the optical signals showing a specific magnitude, which inevitably requests that the optical receiver 88 provides a function in a pre-amplifier or the like to adjust the gain and the threshold, $Vm_1$ to $Vm_3$, for the input optical signal automatically. The suspensions, $Toff_1$ and $Toff_2$, described above are provided for switching the optical communication paths $L_2$.

Figure 2:
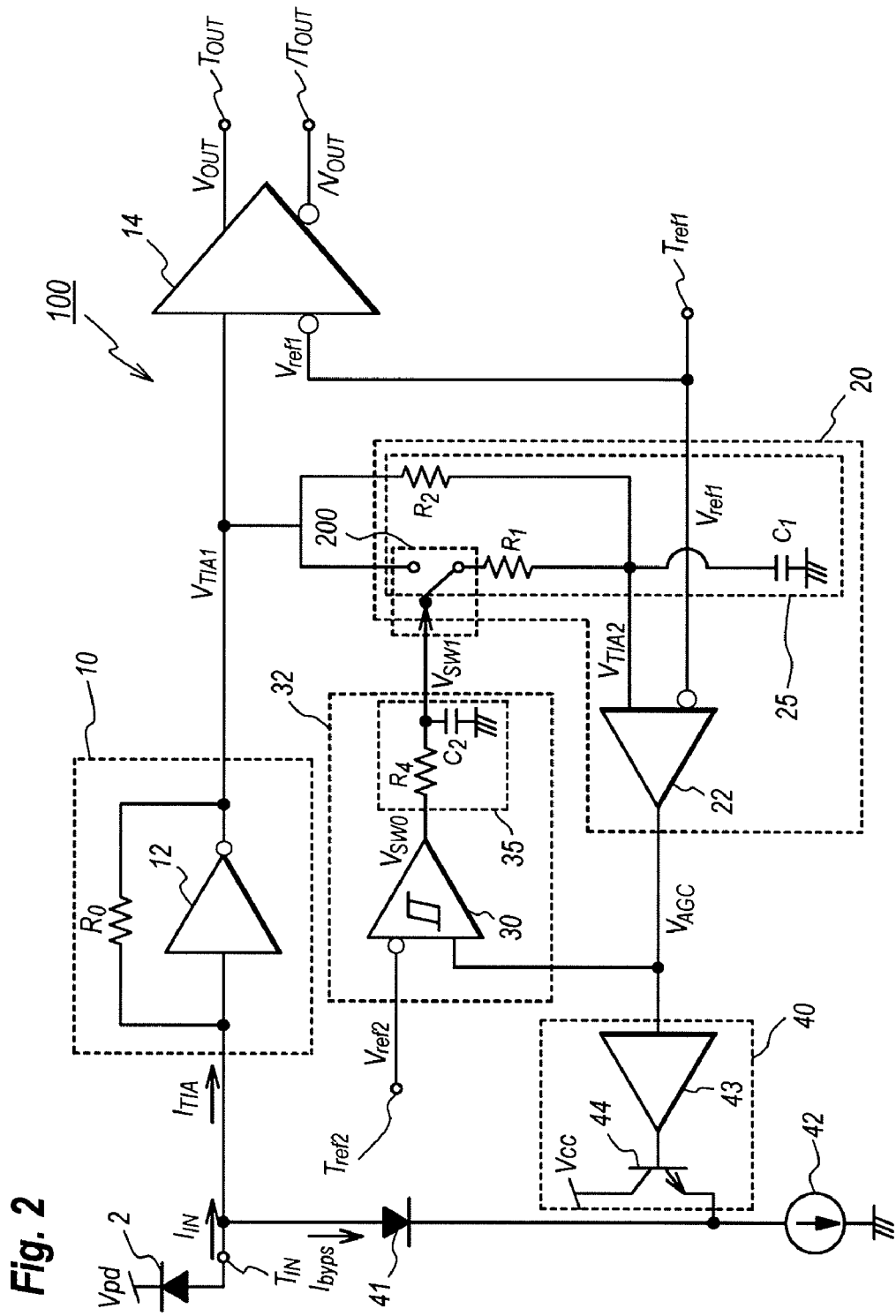
FIG. 2 is a block diagram of the amplifier applicable to the OLT of the PON system.

Next an example of an amplifier 100 installed in the optical receiver 88 will be described. FIG. 2 is a circuit diagram of the amplifier 100 that includes a trans-impedance amplifier (TIA) 10, a differential amplifier 14, a response controller 20, a response selector 32, and a bypass circuit 40. In the arrangement shown in FIG. 2, the time constant of the response controller 20 is assumed to be $\tau 1$. The PD 2, which may convert an input optical signal into a photocurrent $I_{IN}$, is coupled with the input terminal $T_{IN}$ of the amplifier 100 in the anode thereof; while, the cathode of the PD 2 is biased by Vpd. The photocurrent $I_{IN}$ is divided into two parts, that is, the input current $I_{TIA}$ of the TIA 10 and the current $I_{byps}$ for the bypass circuit 40.

The TIA 10 includes an inverting amplifier 12 and a trans-impedance $R_0$. The input current $I_{TIA}$ flowing in the trans-impedance $R_0$ causes a voltage drop thereat, that is, the input current $I_{TIA}$ may be converted to a voltage drop at the trans-impedance $R_0$ to generate a voltage output $V_{TIA1}$ when the input impedance of the inverting amplifier 12 is large enough. The differential amplifier 14 amplifies a difference between two voltage signals, $V_{TIA}$ and $Vref_1$, the latter of which is given at the terminal $Tref_1$. When the output $V_{TIA1}$ of the TIA 10 is greater than the reference $Vref_1$, the non-inverting output of the differential amplifier 14 becomes greater than the inverting-output, $V_{OUT}$>/$V_{OUT}$. The symbol "/" means that the signal denoted by characters subsequent to the symbol has a phase opposite to the phase of the signal without the symbol; that is, the two signals denoted by characters subsequent to the symbol are under the complementary condition. When the output $V_{TIA1}$ of the TIA 10 is less than the reference $V_{ref1}$, two outputs, $V_{OUT}$ and /$V_{OUT}$, show the relation of $V_{OUT}$</$V_{out}$. When the differential amplifier 14 has a function of the limit amplifier where two outputs thereof are limited in the magnitudes thereof; the two outputs, $V_{OUT}$ and /$V_{OUT}$, may show the rectangular shape.

The response controller 20 includes two resisters, $R_1$ to $R_2$, a switch 200, a capacitor $C_1$, and a linear amplifier 22. Resistors, $R_1$ and $R_2$, and the capacitor $C_1$ constitute an integrator 25 for the output $V_{TIA1}$ of the TIA 10, while, the switch 200 is put between the resistor $R_1$ and the output $V_{TIA1}$. In the integrator 25, the resistance of the first resistor $R_1$ is less than that of the second resistor $R_2$. When the switch 200 turns on, the integrator 25 shows a time constant determined by two resistors, $R_1$ and $R_2$, connected in parallel to the others and the capacitor $C_1$, while, the integrator 25 shows another time constant determined by the second resistor $R_2$ and the capacitor $C_1$, which is longer than the time constant above described when the switch 200 turns off. The integrator 25 may integrate the output $V_{TIA1}$ of the TIA 10 by the time constant thus determined and generate an averaged output $V_{TIA2}$.

The linear amplifier 22 receives the output $V_{TIA2}$ of the integrator 25 in the non-inverting input thereof; while, it receives the first reference $V_{ref1}$ in the inverting input thereof. The linear amplifier 22 may amplify a difference between these two signals, $V_{TIA2}$ and $V_{ref1}$, with relatively small gain, typically two, and generates an output $V_{AGC}$ which is sent to the bypass circuit 40 and a hysteresis comparator 30 of the response selector 32.

The time response selector 32 includes the hysteresis comparator 30 and a delay unit 35. One of the inputs $V_{ref2}$ of the hysteresis comparator may vary the level thereof depending on the output thereof, which is not explicitly shown in FIG. 2 but shows the hysteresis performance for the other input $V_{AGC}$ thereof. The delay unit 35 is put in the downstream of the hysteresis comparator 30 and includes a resistor $R_4$ and a capacitor $C_2$. The time constant of the hysteresis comparator 30 is far less than that of the delay unit 35, that is, the time constant of the delay unit 35 substantially determines the time constant of the response selector 32. The hysteresis comparator 30 may compare the output $V_{AGC}$ of the response controller 20 with the second reference $V_{ref2}$. Specifically, when the output $V_{AGC}$ becomes less than the second reference $V_{ref2}$ in the first state thereof $V_{ref2}^{(L)}$; the output $V_{SW0}$ of the hysteresis comparator 30 turns LOW, which converts the second reference $V_{ref2}$ to the second state $V_{ref2}^{(H)}$ from the first state $V_{ref2}^{(L)}$. On the other hand, when the output $V_{AGC}$ exceeds the second state $V_{ref2}^{(H)}$ of the second reference $V_{ref2}$, the output $V_{SW0}$ turns HIGH and the second reference $V_{ref2}$ changes to the first state $V_{ref2}^{(L)}$.

The delay unit 35 may generate a delayed signal $V_{SW1}$ which is delayed from the output $V_{SW0}$ of the hysteresis comparator 30. Accordingly, the response selector 32 may generate a delayed control signal $V_{SW1}$ by comparing the output $V_{AGC}$ of the response controller 20 with the second reference $V_{ref2}$ in the hysteresis mode.

The switch 200 is driven by the delayed signal $V_{SW1}$ output from the delay unit 35. The delayed signal $V_{SW1}$ in the HIGH level turns on the switch 200, which reduces the parallel resistance of two resistors, $R_1$ and $R_2$, and decreases the time constant of the integrator 25 to $\tau_{a1}$. On the other hand, the delayed signal $V_{SW1}$ in the LOW level turns off the switch 200, which increases the time constant of the integrator 25 to $\tau_{L1}$.

The photocurrent $I_{IN}$ is bypassed by the diode 41 and the current source 42 connected in series to the diode 41. The bypass circuit 40, which includes a buffer 43 and a transistor 44 put in the downstream of the buffer 44, provides a surplus current to the current source 42. The buffer 43 may transmit the output $V_{AGC}$ of the response controller 20 to the transistor 44. When the output $V_{AGC}$ lowers, the magnitude of the surplus current provided from the transistor 44 to the current source 42 decreases, which increases the bypass current $I_{byps}$ shunt from the photocurrent current $I_{IN}$. Thus, the bypass circuit 40 may adjust the input current $I_{TIA}$ for the TIA 10 based on the output $V_{AGC}$ of the response controller 20, which is equivalent to the output $V_{TIA1}$ of the TIA 10. Increasing the photocurrent $I_{IN}$ which lowers the output $V_{TIA1}$ of the TIA 10 as already described; accordingly, the output $V_{AGC}$ of the response controller 20 reduces but the magnitude of the bypassing current $I_{byps}$ increases, which decreases the input current $I_{TIA}$ of the TIA 10. Thus, the feedback loop of the response controller 20 and the bypass circuit 40 may suppress the output $V_{TIA1}$ of the TIA 10.

Figure 3:
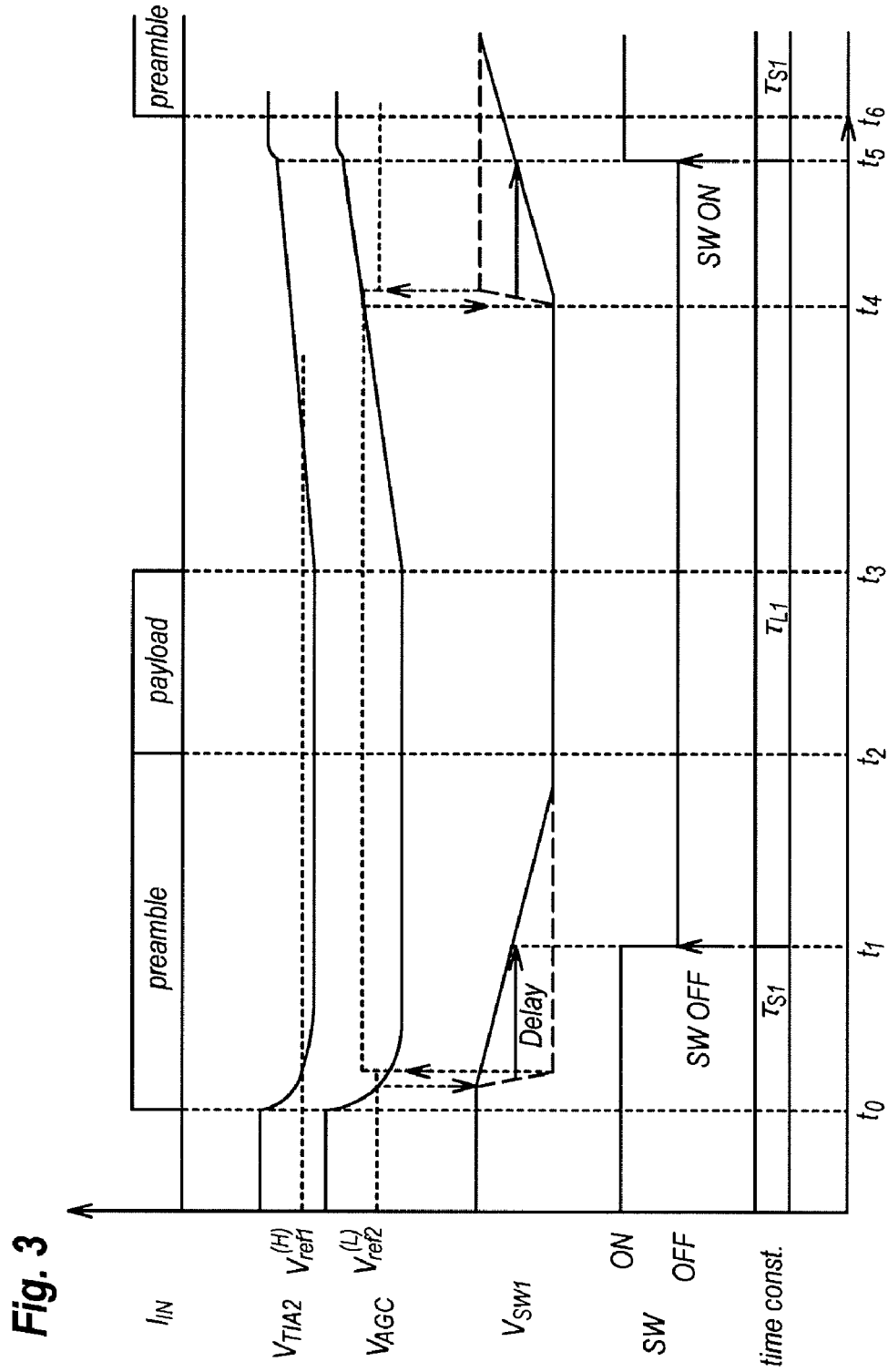
FIG. 3 schematically shows a time chart of signals appeared in the block diagram shown in FIG. 2.

FIG. 3 is a time chart of an operation of the amplifier 100 shown in FIG. 2. FIG. 3 includes behaviors of, from the top, the photocurrent $I_{IN}$, the output $V_{TIA2}$ of the integrator 25, the output $V_{AGC}$ of the response controller 20, the delayed signal $V_{SW1}$, the status of the switch 200, and the time constant of the integrator 25. The broken line appeared in the behavior of the delayed signal $V_{SW1}$ corresponds to a case where no delay unit 35 is put in the downstream of the hysteresis comparator 30, in which the output $V_{SW0}$ of the hysteresis the comparator 30 directly controls the switch 200.

The photocurrent $I_{IN}$ includes a preamble and a payload; the former of which is for stabilizing the control signal $V_{AGC}$, that is, averaging the output $V_{TIA1}$ of the TIA 10; while, the payload includes practical data to be transmitted. The preamble starts at $t_0$ but ends at $t_2$. At the same time of the ending of the preamble, the payload start at $t_2$, and ends at $t_3$. The preamble next starts at $t_5$. The time constant $\tau_1$ of the response controller 20 changes to the shorter state $\tau_{S1}$ at t1 while switches to the longer state $\tau_{L1}$ at $t_4$.

Assuming that the delay unit 35 initializes the output $V_{SW1}$ thereof in HIGH, the time constant $\tau_1$ of the integrator 25 is set in the shorter state $\tau_{S1}$. Inputting the preamble, the output $V_{TIA2}$ of the integrator 25 approaches the average of the output $V_{TIA1}$ of the TIA 10 by the time constant $\tau_{S1}$. Because the gain of the linear amplifier 22 is set about 2, the output $V_{AGC}$ thereof also approaches a value corresponding to the average of the output $V_{TIA1}$ as following the decrease of the output $V_{TIA2}$, the bypass circuit 40 lowers the current flowing out from the transistor 44, then the bypass current $I_{byps}$ increases, which decreases the input current $I_{TIA}$, and operates the auto-gain-control ($_{AGC}$) function.

The response selector 32 includes the delay unit 35; accordingly, the delayed signal $V_{SW1}$ delays with respect to the output $V_{AGC}$, and the switch 200 turns off at the instant $t_1$ to switch the time constant $\tau_1$ of the integrator 25 from $\tau_{S1}$ to $\tau_{L1}$.

At the instant $t_3$ at which the payload ends, the output $V_{TIA2}$ of the integrator 25 and that of the response controller 20 $V_{AGC}$ gradually increase according to the longer time constant $\tau_{L1}$. At the instant $t_4$ when the output $V_{AGC}$ of the response controller 20 exceeds the second state $V_{ref2}^{(H)}$ of the second reference $V_{ref2}$, the hysteresis comparator 30 inverts the output $V_{SW0}$ thereof and changes the second reference $V_{ref2}$ from the second state $V_{ref2}^{(M)}$ to the first state $V_{ref2}^{(L)}$. After the delay of the delay unit 35, the switch 200 turns on to change the time constant $\tau_1$ of the integrator 25 from the longer state $\tau_{L1}$ to the shorter state $\tau_{S1}$ at the instant $t_5$. The next packet comes at the instant $t_6$.

Figure 4:
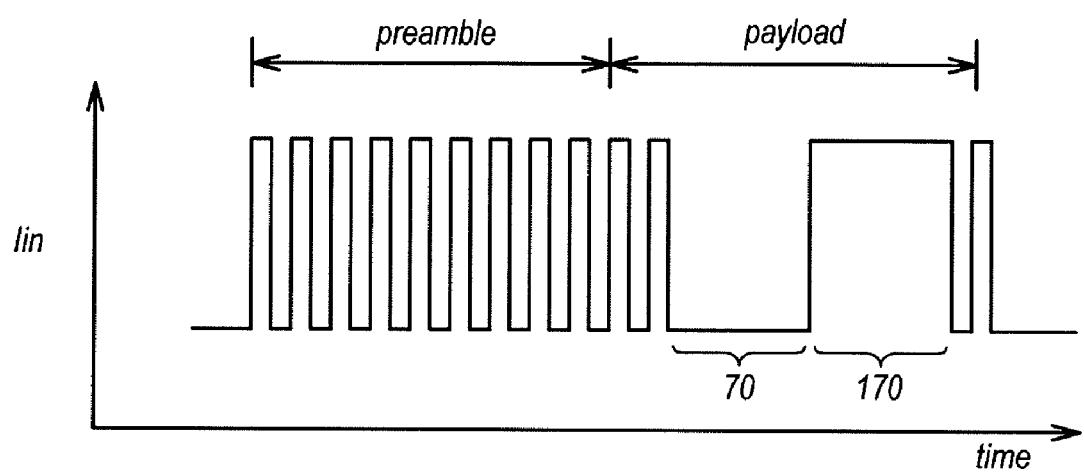
FIG. 4 schematically shows an arrangement of the data received by the amplifier shown in FIG. 2.

FIG. 4 shows a typical example of the input photocurrent $I_{IN}$. The photocurrent $I_{IN}$ constitutes the preamble and the payload. The preamble is for stabilizing the output $V_{AGC}$ of the response controller 20 with a plurality of HIGHs and LOWs alternating to each other by a preset period. As described, the optical data received by the OLT 82 in the central office inherently shows various magnitudes. The preamble may compensate those various received data. While, the payload includes information to be transmitted and may include sequences with continuing HIGH states 170 or LOW states 70.

In order to receive the payload stably, the longer time constant $\tau_{L1}$ is preferably as long as possible. However, in order to follow respective data packets, the time constant $\tau_1$ of the response controller 20 is necessary to switch from the longer state $\tau_{L1}$ to the shorter state $\tau_{S1}$ as fast as possible to initialize the response controller. Subjects inconsistent to each other may cause an unstable operation of the switch 200 and the response controller 20. Next, the unstable operation above will be described in detail.

Figure 5:
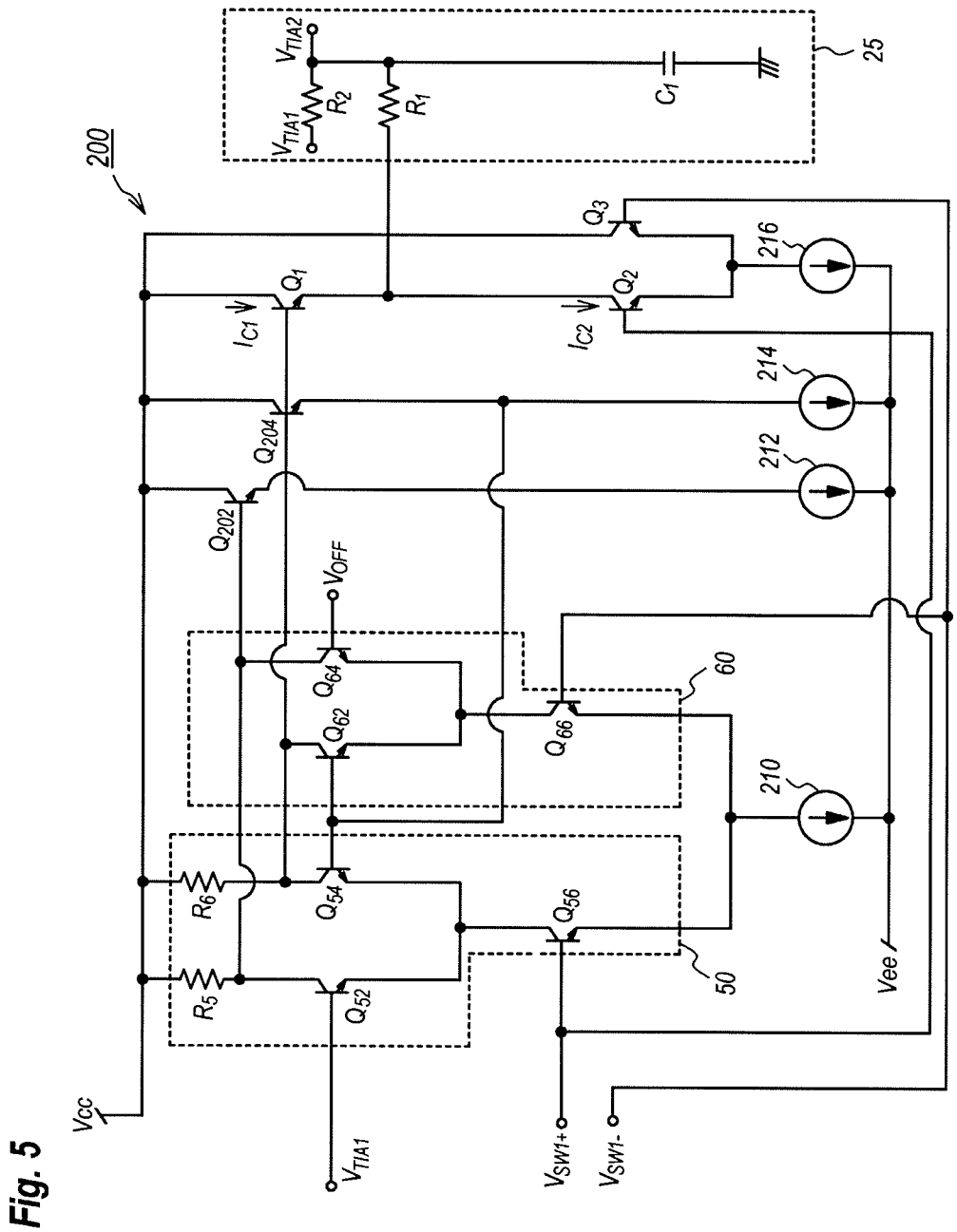
FIG. 5 is a circuit diagram of the switch appeared in FIG. 2.

FIG. 5 is an exemplary circuit of the switch 200, which includes first and second differential circuits, 50 and 60; emitter followers each including a transistor, $Q_{202}$ and $Q_{204}$, and a current source, 212 and 214; three output transistors, $Q_1$ to $Q_3$; and some current sources, 210 and 216. The differential circuits, 50 and 60, are positively biased by the power supply Vcc through two load resistors, $R_5$ and $R_6$. Two emitter followers, $Q_{202}$ and $Q_{204}$, and the transistor $Q_1$ are also positively biased by the power supply Vcc. Four current sources, 210 to 216, are negatively biased by the other power supply Vee, where the other power supply Vee in the level thereof is lower than the level of the power supply Vcc.

The first differential circuit 50 includes two load resistors, $R_5$ and $R_6$, a pair of transistors, $Q_{52}$ and $Q_{54}$, and a common transistor $Q_{56}$ connected to respective emitters of the paired transistors, $Q_{52}$ and $Q_{54}$, in the collector thereof; while, the emitter of the common transistor $Q_{56}$ is connected to the current source 210. The switch 200 receives the output $V_{TIA1}$ of the TIA 10 in the base of one of the paired transistors $Q_{52}$ of the first differential circuit 50; while, the base of the other paired transistor $Q_{54}$ is connected to a base of one of paired transistor of the second differential circuit 60 and also directly connected to an output of one of the emitter followers. The base of the common transistor $Q_{56}$ receives the delayed signal $V_{SW1+}$.

The second differential circuit 60 includes a pair of transistors, $Q_{62}$ and $Q_{64}$, and a common transistor $Q_{66}$ connected to respective emitters of the paired transistors, $Q_{62}$ and $Q_{64}$. The paired transistors, $Q_{62}$ and $Q_{64}$, are biased by the power supply Vcc through the load resistors, $R_5$ and $R_6$; that is, two load resistors, $R_5$ and $R_6$, are commonly connected to the first and second differential circuits, 50 and 60. The base of one of the paired transistors $Q_{62}$ is, as described above, connected to the base of one of paired transistors $Q_{51}$ of the first differential circuit 50, and also connected to the output of the emitter follower. The base of the other paired transistor $Q_{64}$ receives a reference bias $V_{OFF}$. The common transistor $Q_{66}$ receives the delayed signal $V_{SW-}$ in the negative phase thereof, where two delayed signals, $V_{SW+}$ and $V_{SW-}$, have an arrangement of a differential signal.

The transistor $Q_{202}$ and the current source 212 constitute an emitter follower that receives the output of the first load resistor $R_5$; while, the transistor $Q_{204}$ and the current source 214 constitute another emitter follower that receives the output of the second load resistor $R_6$. The output of the latter emitter follower is directly fed back to the base of one of the paired transistors, $Q_{54}$ or $Q_{62}$.

In the arrangement of the switch 200 shown in FIG. 5, when the delayed signal $V_{SW1+}$ is HIGH, which means that the other delayed signal $V_{SW1-}$ is LOW, the current of the current source 210 fully flows in the first differential circuit 50. Moreover, the output of the first differential circuit 50, which is given by the emitter of the transistor $Q_{204}$, is fully fed back to the base of the other paired transistors $Q_{54}$; that is, the first differential circuit has the arrangement of, what is called, the voltage follower circuit where the output thereof is fully fed back to the inverting input of the differential circuit and the output thereof fully and completely reflects the non-inverting input thereof which is the output $V_{TIA1}$ of the TIA 10. On the other hand, when the delayed signal $V_{SW1+}$ is set LOW, which means that the other delayed signal $V_{SW1-}$ turns HIGH, the second differential circuit 60 becomes active and the first differential circuit 50 is inactive. In such a condition, the reference bias $V_{OFF}$ is fully and completely reflected in the output of the emitter follower.

Because the base of the transistor $Q_1$ receives the output of the second load resistor $R_6$ and the output of the voltage follower is given by the emitter of the transistor $Q_{204}$/which also receives the output of the second load resistor $R_6$, the emitter level of the transistor $Q_1$ substantially reflects the emitter level of the emitter follower $Q_{201}$. As described above, the output of the voltage follower substantially reflects the input $V_{TIA1}$ thereof or the reference bias $V_{OFF}$; accordingly, the emitter of the transistor $Q_1$ also reflects the output $V_{TIA1}$ of the TIA 10 or the reference bias $V_{OFF}$. Moreover, the transistor $Q_1$ is a load of the third differential circuit constituted by the paired transistors, $Q_2$ and $Q_3$, and the current source 216. The paired transistors, $Q_2$ and $Q_3$, differentially driven by the delayed signals, $V_{SW1+}$ and $V_{SW1-}$; accordingly, when the delayed signal $V_{SW1+}$ is HIGH, which makes one of the paired transistors $Q_2$ active, the voltage follower of the first differential circuit 50 and the emitter follower reflects the output $V_{TIA1}$ in the output thereof, and this output is also reflected in the emitter of the transistors $Q_1$. As a result, the output $V_{TIA1}$ of the TIA 10 is substantially reflected in the output of the switch 200 when the delayed signal $V_{SW1+}$ is HIGH; while, when the delayed signal $V_{SW1+}$ is LOW, which reflects the reference bias $V_{OFF}$ in the output of the voltage follower. Assuming the reference bias $V_{OFF}$ is low enough to turn the transistors, $Q_{204}$ and $Q_1$, off; then, the output of the switch 200 becomes a state of, what is called, the high impedance where two transistors, $Q_1$ and $Q_2$, connected to the output of the switch 200 are off.

When the delayed signal $V_{SW1+}$ is LOW, the time constant of the integrator 25 may be determined by the series circuit of the resistor $R_2$ and the capacitor $C_1$, which gives the longer time constant $\tau_{L1}$. On the other hand, when the delayed signal $V_{SW1+}$ is HIGH and the output $V_{TIA1}$ is reflected in the output of the switch 200, the time constant of the integrator 25 may be determined by a series circuit of the capacitor $C_1$ and two resistors, $R_1$ and $R_2$, equivalently connected in parallel to the other, which gives the shorter time constant $\tau_{S1}$.

Figure 6:
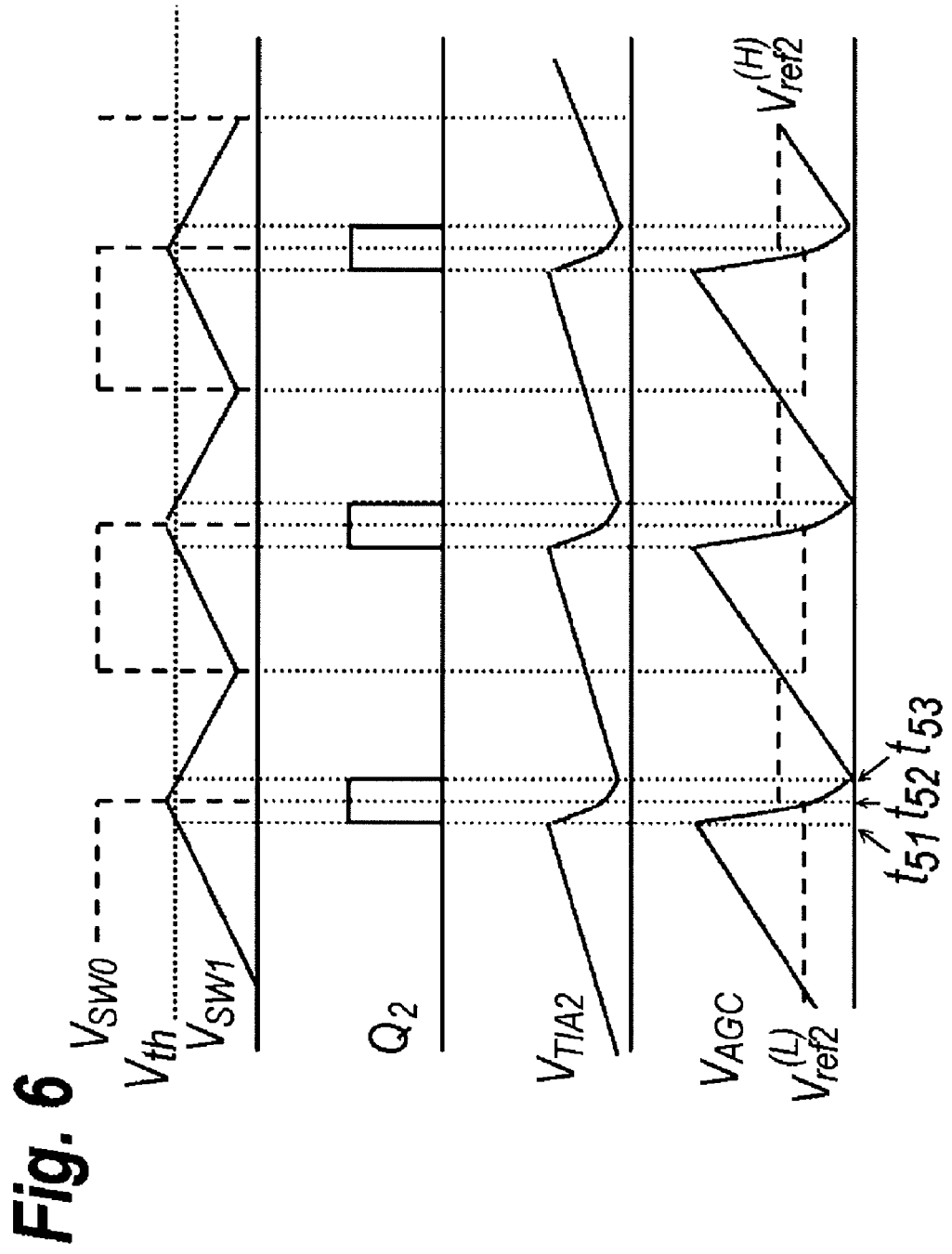
FIG. 6 shows an unstable response of the feedback loop to control the switch.

Next, one subject of the switch 200 will be described. The subject is due to the delayed switching of the transistor $Q_1$. FIG. 6 shows timing behaviors of various signals around the instant $t_5$ at which the switch 200 changes the status from OFF to ON. First, the delayed signal $V_{SW1}$ gradually increases because of the output $V_{SW0}$ of the hysteresis comparator 35 is kept HIGH. When the delayed signal $V_{SW1}$ exceeds the threshold $V_{th}$, the transistor $Q_2$, which is directly driven by the delayed signal $V_{SW1}$, turns on at the instant $t_{51}$ but the other transistor $Q_1$ is left off. In such a condition, only the transistor $Q_2$ is coupled with the capacitor $C_1$, which discharges the capacitor $C_1$ through the resistor $R_1$ and the transistor $Q_2$, and the level of the output $V_{TIA2}$ abruptly decreases. Because the liner amplifier 22 has the moderate gain of around two or less, the decrease of the output level $V_{TIA2}$ may be directly reflected to the output $V_{AGC}$ thereof. When the output $V_{AGC}$ becomes less than the first state of the second reference $V_{ref2}^{(L)}$ at the instant $t_{52}$, the hysteresis comparator reverses the output $V_{SW0}$ thereof, which decreases the delayed signal $V_{SW1}$. Finally, the transistor $Q_2$ turns off at the instant $t_{53}$ when the delayed signal $V_{SW1}$ becomes less than the threshold $V_{th}$. Then, the capacitor $C_1$ may be charged by the output $V_{TIA1}$ of the TIA 10 through the resistor $R_2$, and the output $V_{TIA2}$ of the integrator 25 gradually begins to increase again at the instant $t_{53}$. The increase of the output $V_{TIA2}$ may be also reflected in the increase of the control signal $V_{AGC}$, and at the instant when the control signal $V_{AGC}$ exceeds the second state of the second reference $V_{ref2}^{(h)}$ which reverses the output $V_{SW0}$ of the hysteresis comparator 35, the delayed signal $V_{SW1}$ begins again to increase. Thus, in a case where the transistor $Q_1$ is out of the consideration, the switch 200 and the control loop including the integrator 25, the linear amplifier 22, the hysteresis comparator 30, and the delayed circuit 35, inherently has a possibility to fall in unstable. Although the consideration above ignores the status of the transistor $Q_1$, the unstable situation may occur when the transistor $Q_1$ turns on after the transistor turns off.

Considering the function of the transistor $Q_1$, if the transistor $Q_1$ may supply the current, or may compensate the discharge of the capacitor $C_1$, that is, when the transistor $Q_1$ supplies the current to the other transistor $Q_2$ before the control signal $V_{AGC}$ crosses the second reference $V_{ref2}^{(L)}$; the instability of the control loop may be solved. Or, if the decrease of the control signal $V_{AGC}$ after the transistor $Q_2$ turns on may be kept within a level not to reverse the hysteresis comparator 30, the instability above described may be overcame. Next, techniques to escape the instability will be described by referring to some embodiments of the present invention.

Figure 7:
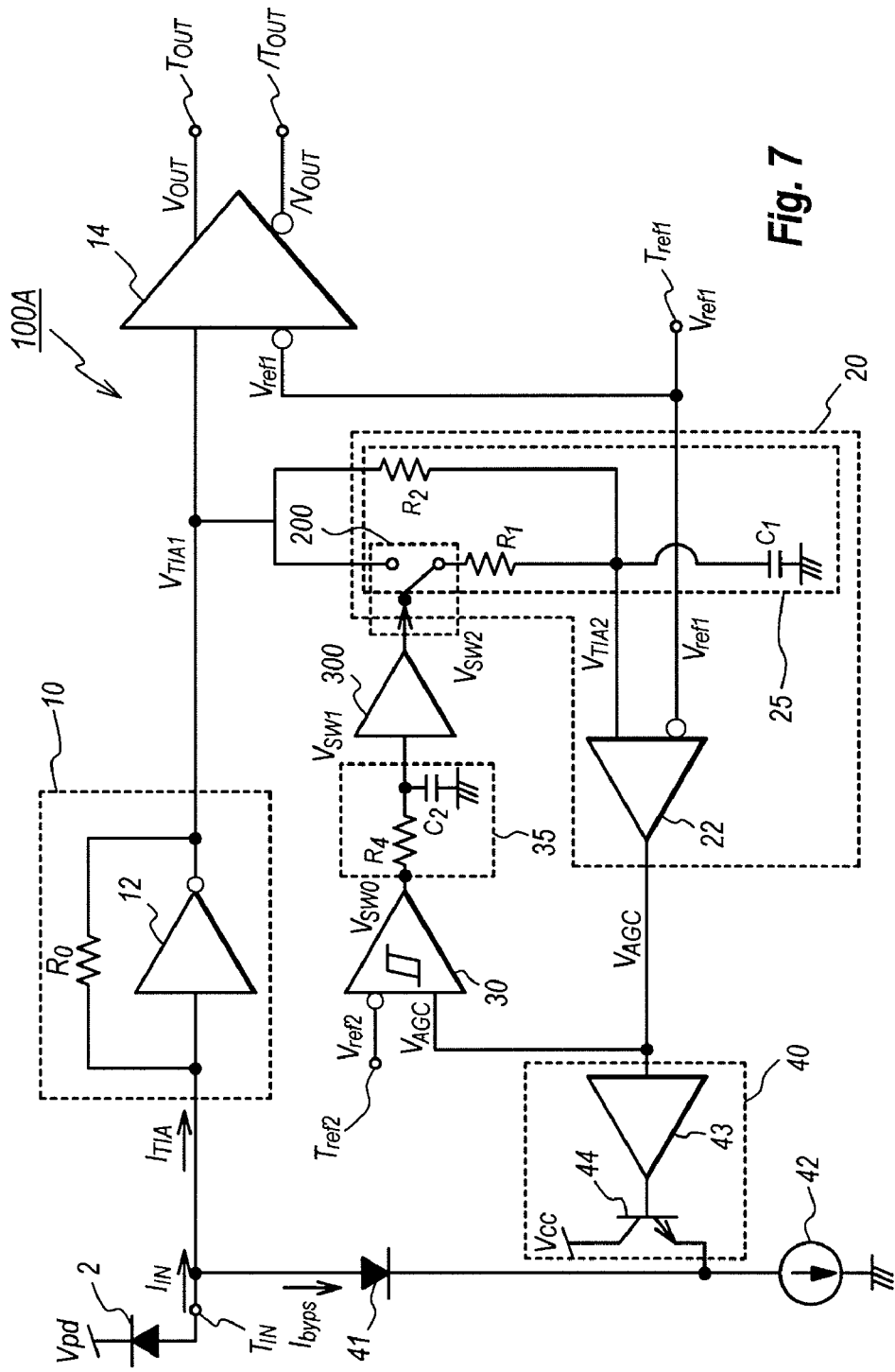
FIG. 7 is a block diagram of an amplifier modified from those shown in FIG. 2.

FIG. 7 shows a block diagram of a modified amplifier 100A according to an embodiment of the invention. The amplifier 100A further includes, in addition to those shown in FIG. 2, a buffer 300 put between the delay unit 35 and the switch 200 and the buffer 300 has a gain thereof greater than unity.

Figure 8:
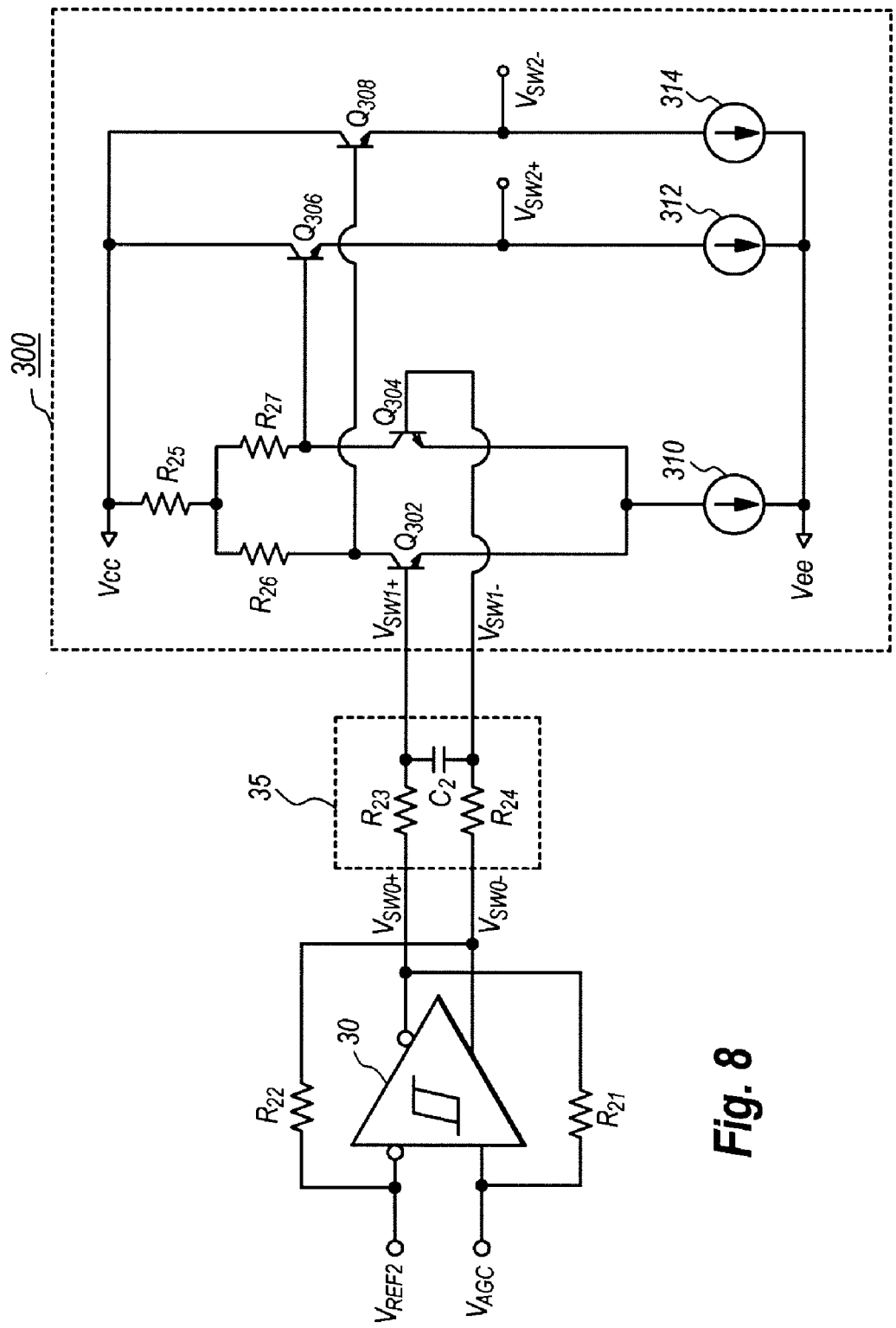
FIG. 8 is a circuit diagram of the hysteresis comparator, the delay unit, and the buffer installed in the modified amplifier shown in FIG. 7.
Figure 9:
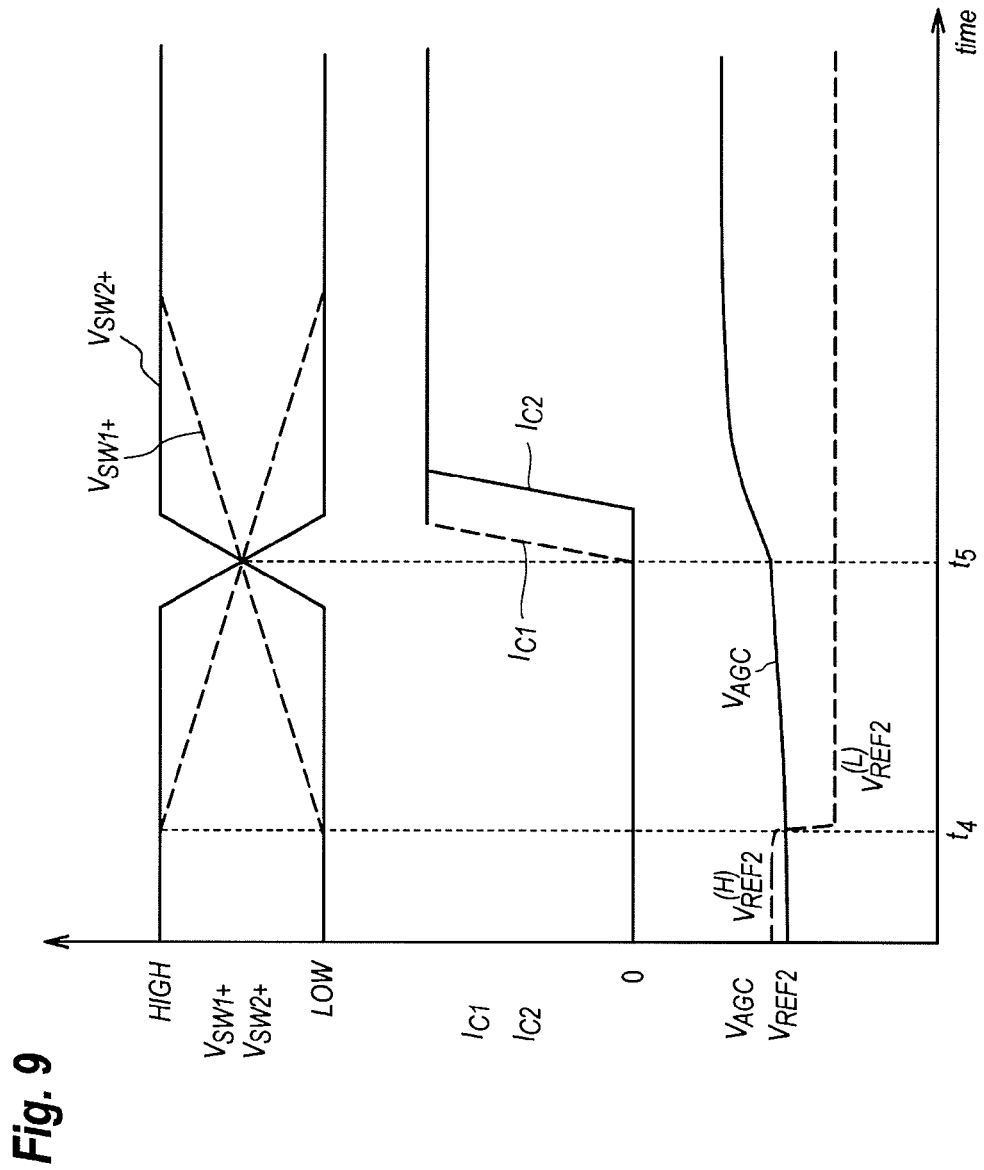
FIG. 9 schematically shows a time chart of signals appeared in the circuit shown in FIG. 8.

FIG. 8 is a circuit diagram of the buffer 300. FIG. 8 includes the hysteresis comparator 30 and the delay unit 35 each of which has a differential arrangement. As shown in FIG. 8, the delay unit 35 includes two resistors, $R_{23}$ and $R_{24}$, and a capacitor $C_2$; while, the buffer 300 includes a differential circuit comprising a pair of transistors, $Q_{302}$ and $Q_{304}$, a pair of load resistors, $R_{26}$ and $R_{27}$, a common resistor $R_{25}$, and a current source 310; and a pair of emitter followers each including a transistor, $Q_{306}$ and $Q_{308}$, and a current source, 312 or 314. FIG. 2 includes the unbalanced delay unit 35, but the amplifier 100A may include a balanced delay unit 35 as shown in FIG. 9, which includes two resistors, $R_{23}$ and $R_{24}$, put in respective signal lines, and the capacitor $C_2$ connected between two signal lines. The balanced delay unit 33 may receive the outputs, $V_{SW0+}$ and $V_{SW1-}$, with the differential arrangement and may output delayed signal $V_{SW1+}$ and $V_{SW1-}$, also with the differential mode to the inputs of the differential buffer 300.

The common resistor $R_{25}$ connects two resistors, $R_{26}$ and $R_{27}$ to the positive power supply Vcc. The resistors, $R_{26}$ and $R_{27}$, are the load resistor for the paired transistors, $Q_{302}$ and $Q_{304}$, where they constitute an ordinary differential circuit with the current source 310 connected to respective emitters. Each emitter follower may receive the output of the paired transistors, $Q_{302}$ and $Q_{304}$; that is, the input of the emitter follower, namely, the base of respective transistors, $Q_{306}$ and $Q_{308}$, is connected to the collector of the paired transistors, $Q_{302}$ and $Q_{304}$. Thus, the differential output of the delay unit 35 may be amplified by the differential buffer 300 to generate amplified delayed signals, $V_{SW2+}$ and $V_{SW2-}$, complementary to each other.

The operation of the buffer 300 with the delay unit 35 shown in FIG. 9 will be described. FIG. 9 is a time chart of signals attributed to the buffer 300. At the instant $t_4$, the hysteresis comparator 30 reverses the output thereof; accordingly, the second reference $V_{ref2}$ changes the level thereof from the second state $V_{ref2}^{(H)}$ to the first state $V_{ref2}^{(L)}$. Because of the existence of the delay unit 35, the turning on the transistor $Q_2$ in the switch 200 is delayed to the instant $t_5$, which follows the aforementioned arrangement shown in FIG. 5. However, the buffer 300 put in the downstream of the delay unit 35 may accelerate the switching.

That is, the buffer 300 may increase the loop gain of the feedback loop constituted by the integrator 25, the linear amplifier 22, the hysteresis comparator 30, the delay unit 35, and the buffer 300, which may operate the loop further stably. The unintentional reversing of the switch 200 described above may be prevented. Even the transistor $Q_2$ discharges the capacitor $C_1$, the transistor $Q_1$ may charge the capacitor $C_1$ just after the discharging; the abrupt decrease of the output $V_{TIA2}$ of the integrator 25 may be suppressed.

Figure 10:
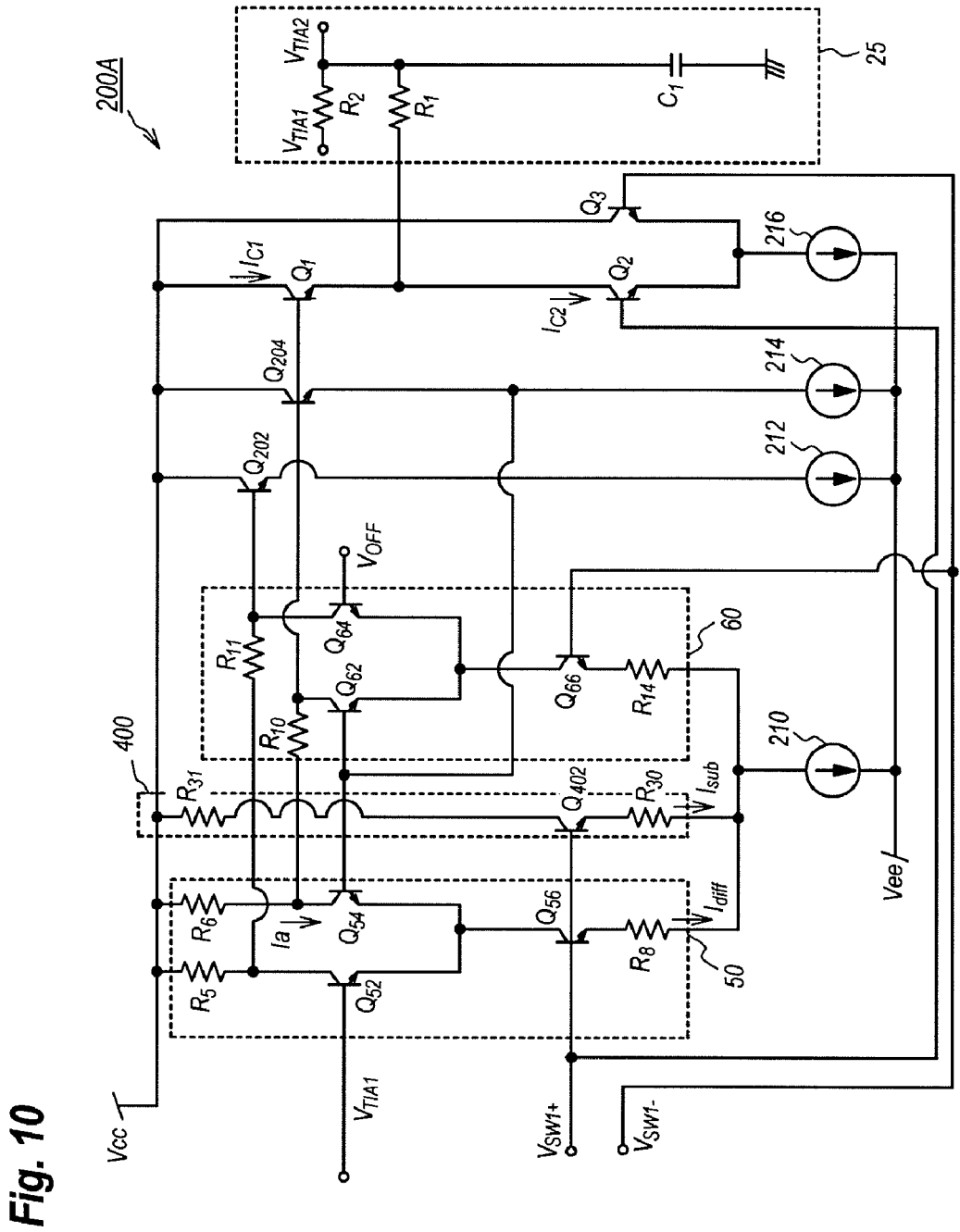
FIG. 10 is a circuit diagram of an amplifier still modified from those shown in FIG. 5.

Another embodiment according to the present invention provides a current feeder 400 in the switch 200A such as those shown in FIG. 10. The current feeder 400 includes two resistors, $R_{30}$ and $R_{31}$, and an additional transistor $Q_{402}$, put between the positive power supply Vcc and the current source 210. The switch 200A further includes two resistors, $R_{10}$ and $R_{11}$, between two differential circuits, 50 and 60, that is the former differential circuit 50 provides the load resistor, $R_5$ and $R_6$, constituted by the single unit; while, the load of the latter differential circuit 60 is constituted by two resistors, $R_5$ and $R_{11}$, connected in series for the transistor $Q_{64}$ and two resistors, $R_6$ and $R_{10}$, for the other transistor $Q_{62}$. Other arrangements of the switch 200A are same as those shown in FIG. 5.

The base of the additional transistor $Q_{402}$ receives one of the delayed signals $V_{SW1+}$. Setting the delayed signal $V_{SW1+}$ in HIGH, the transistors, $Q_{56}$ and $Q_{402}$, turn on to flow the current therein. Because the current feeder 400 supplies the additional current $I_{sub}$, the current $I_{diff}$ flowing in the paired transistors $Q_{56}$ becomes less than the current when the switch 200 provides no current feeder 400. In other words, the differential circuit 50 shown in FIG. 9 provides the current $I_{diff}$ less than the current flowing in the differential circuit 50 of the switch 200 shown in FIG. 5, even the base input level $V_{SW1+}$ is the same. Similarly, the current flowing in the path of the transistor $Q_{54}$ opposite to the path of the transistor $Q_{52}$ becomes smaller.

The base input level of the transistor $Q_1$ depends on the current flowing in the load resistor $R_6$ and the resistance of thereof; that is, the base input level of the transistor $Q_1$ may be given by the voltage drop by the load resistor $R_6$ from the positive power supply, $Vcc - I_a \times R_6$. The current feeder 400 of the switch 200A may decrease the current $I_{diff}$ flowing in the differential circuit 50 and the base level of the transistor $Q_1$ may increase because of the lesser voltage drop by the load resistor $R_6$.

Figure 11:
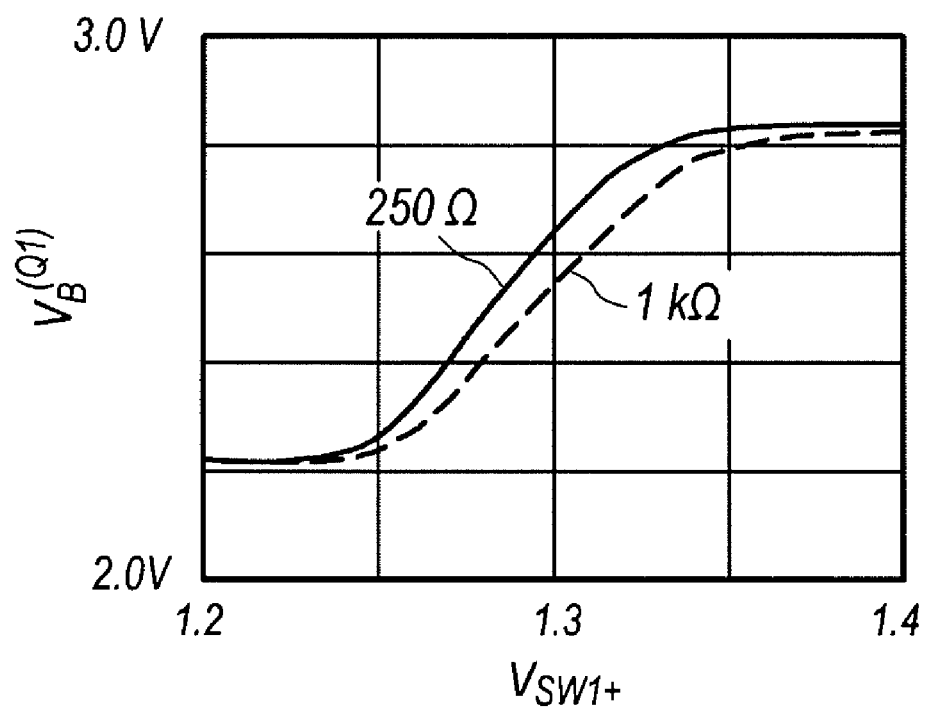
FIG. 11 shows a behavior of the base input level of the output transistor depending on the resistance of the resistor in the current feeder.

FIG. 11 shows the behavior of the base level of the transistor $Q_1$ with respect to the transition of the delayed signal $V_{SW1+}$. Broken lines in respective figures correspond to a case where the resistor $R_{30}$ has the resistance of 1 kΩ; while, solid lines correspond to the resistance of 250Ω.

FIG. 11 illustrates the behavior of the base level $V_B^{(Q1)}$ of the transistor $Q_2$ against the delayed signal $V_{SW1+}$, where base level $V_B^{(Q1)}$ of 1.2 V sets the transistor $Q_1$ OFF, while, that of 1.4 V sets the transistor $Q_1$ ON. In FIG. 11, the solid line corresponds to the emitter resistor R30 of the current feeder 400 of 250Ω, while, the broken line corresponds to the resistance of 1 kΩ. The former case, where the resistance of 250Ω, shows that the base level $V_B^{(Q1)}$ increases in a smaller delayed signal $V_{SW1+}$. A smaller resistance for the emitter resistor R30 in the current feeder 400 increases the subtracted current Isub, which equivalently decreases the differential current Idiff flowing in the differential circuit 50; accordingly, the voltage drop by the resistance R6 is decreased and the base level $V_B^{(Q1)}$ may increase.

When the delayed signal $V_{SW1+}$ is LOW to make the differential circuit 60 active, the base level $V_B^{(Q1)}$ of the transistor $Q_1$ may be determined by two ways, one of which is derived from the output of the voltage follower. That is, as described, the output of the voltage follower is substantially identical with the value of the non-inverting input thereof, which is set in the reference bias $V_{OFF}$ and the base level $V_B$ of the transistor $Q_1$ is given by $V_{OFF} + V_{be}$, where $V_{be}$ is the forward bias voltage between the base and the emitter of the pn-junction transistor which is typically becomes around 0.75V. Another condition may be forwardly derived from the voltage drop at the load resistor, $R_5$ and $R_6$.

In order to turn off the transistor $Q_1$ completely, the base-emitter voltage thereof is necessary to be less than the forward bias voltage; that is, $$V_{OFF} + V_{be} - V_{TIA2} < V_{be},$$

$$V_{OFF} < V_{TIA2}.$$

The condition that the reference $V_{OFF}$ is less than the output $V_{TIA2}$ of the integrator 25 is the absolute condition to turn off the transistor $Q_1$.

On the other hand, when the delayed signal $V_{SW1+}$ is HIGH, the base level of the transistor $Q_1$ becomes $V_{TIA1} + V_{be}$. The switching time of the transistor $Q_1$ from the off-state to the on-state depends on the difference between the value $V_{OFF}$ and the value $V_{TIA2}$.

Figure 12:
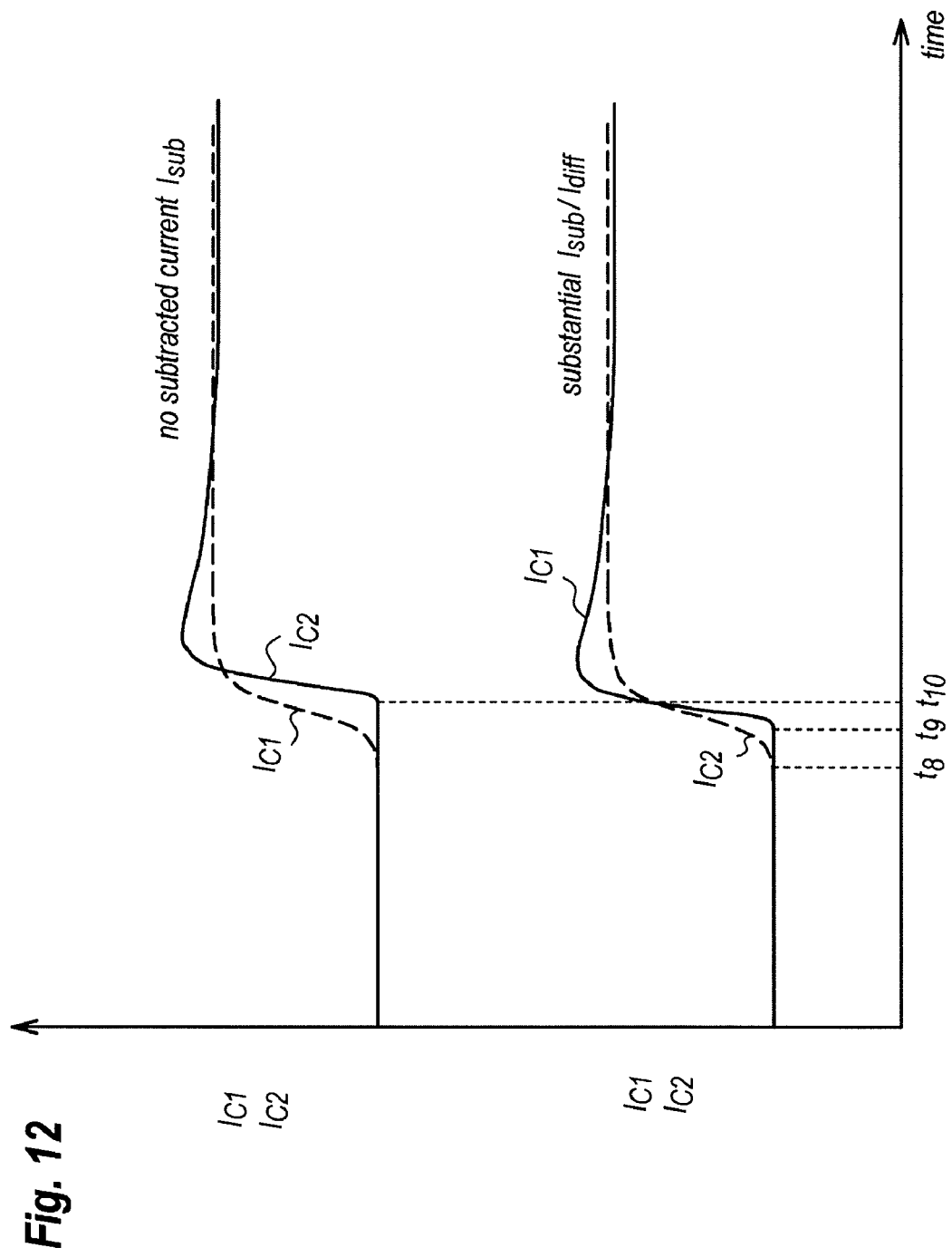
FIG. 12 compares the turn-on currents of the output transistors in a case of no subtracted current with another case of substantial subtracted current flowing in the current feeder.

The switching of the transistors, $Q_1$ and $Q_2$, will be described in further detail. FIG. 12 shows the behaviors of the collector currents, $I_{C1}$ and $I_{C2}$, corresponding to the transistor, $Q_1$ and $Q_2$, respectively. The upper behavior is the case without the current feeder 400, while, the lower case corresponds to the case where the substantial ratio Isub/Idiff of the currents is set.

When no subtracted current is provided, the current $I_{C1}$ of the transistor $Q_1$ rises at the instant $t_{10}$ delayed from the instant $t_8$ when the current of the second transistor $Q_1$. On the other hand, when the ratio Isub/Idiff is set to be a substantial value, the current $I_{C1}$ of the transistor $Q_1$ rises at the instant $t_9$ after the rising of the current $I_{C2}$ but the delay from the instant $t_8$ is less than the delay of the case above. Thus, adding the current feeder 400 and setting the current ratio Isub/Idiff, the feedback loop constituted by the integrator 25, the linear amplifier 22, the hysteresis comparator 30, and the delay unit 35 may stably operate without showing any self oscillation.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. An amplifier, comprising:
   a trans-impedance amplifier to convert a current signal into a voltage signal;
   an integrator capable of changing between a longer time constant and a shorter time constant;
   a linear amplifier to amplify an output of the integrator;
   a comparator to compare an output of the linear amplifier;
   a delay unit to delay an output of the comparator; and
   a switch to switch the time constants of the integrator, the switch having a first voltage follower and a second voltage follower, the first voltage follower reflecting the voltage signal converted by the trans-impedance amplifier to the integrator, the second voltage follower setting an output thereof in a high-impedance state,
   wherein the delay unit selects one of the first voltage follower and the second voltage follower depending on an output of the comparator.

2. The amplifier of claim 1,
   wherein the integrator includes a first resistor, a second resistor, and a capacitor, the first resistor receiving an output of the first voltage follower, the second resistor receiving the voltage signal output from the trans-impedance amplifier, the capacitor being connected to the first and second resistors,
   wherein the second resistor and the capacitor constitute the integrator with the longer time constant, and the first and second resistors equivalently connected in parallel and the capacitor constitute the integrator with the shorter time constant.

3. The amplifier of claim 1,
   wherein the switch includes a first differential circuit, a second differential circuit, and an emitter follower commonly connected to the first and second differential circuits,
   wherein the first differential circuit receives the voltage signal output from the trans-impedance amplifier in one input thereof and receives an output of the emitter follower in another input thereof to constitute the first voltage follower,
   wherein the second differential circuit receives a control level in one input thereof and receives the output of the emitter follower in another input thereof to constitute the second voltage follower, and
   wherein the switch further includes a third differential circuit that transfers an output of the first voltage follower to the integrator when the delay unit selects the first voltage follower, and sets the output of the second voltage follower in the high-impedance state when the delay unit selects the second voltage follower.

4. The amplifier of claim 3,
   wherein the third differential circuit includes first to third transitors, the first and second transistors constituting a differential pair to receive the output of the delay unit and the third transistor receiving the output of the emitter follower and being connected to the first transistor as a load, and
   wherein the first and the third transistors turn on to transfer the output of the first differential circuit to the integrator when the first differential circuit is selected, and the first and third transistors turn off to set the output of the third differential circuit in the high-impedance state.

5. The amplifier of claim 1,
   further comprising a buffer put between the delay unit and the integrator,
   wherein the buffer has a gain greater than unity to set the selecting of the first voltage follower and the second voltage follower in the switch faster.

6. The amplifier of claim 5,
   wherein the comparator is a hysteresis comparator, and
   wherein the hysteresis comparator, the delay unit and the buffer each have a differential arrangement.

7. The amplifier of claim 6,
   wherein the delay unit includes two resistors put in respective signal lines of the differential arrangement and a capacitor connected between the signal lines, and
   wherein two resistors and the capacitor constitute a low pass filter.

8. The amplifier of claim 6,
   wherein the hysteresis comparator includes two inputs and two outputs with one of the inputs being coupled to one of the outputs with a phase opposite that of the said one of the inputs, and the other input of the hysteresis comparator being coupled to the other of the outputs of the hysteresis comparator.

9. The amplifier of claim 1,
   wherein the switch includes a first differential circuit, a second differential circuit, and an emitter follower commonly connected to the first and second differential circuits,
   wherein the first differential circuit includes two transistors constituting a differential pair and a current feeder connected in parallel to the differential pair, the differential pair and the current feeder being commonly connected to a current source, the differential pair receiving the voltage signal output from the trans-impedance amplifier in one input thereof and an output of the emitter follower in another input thereof to constitute the first voltage follower,
   wherein the second differential circuit receives a control level in one input thereof and receives the output of the emitter follower in another of input thereof to constitute the second voltage follower, and
   wherein the switch further includes a third differential circuit that transfers an output of the first voltage follower to the integrator when the delay unit selects the first voltage follower, and sets the output of the second voltage follower in the high-impedance state when the delay unit selects the second voltage follower.

* * * * *